United States Patent [19]

Lade et al.

[11] 4,295,058
[45] Oct. 13, 1981

[54] RADIANT ENERGY ACTIVATED SEMICONDUCTOR SWITCH

[75] Inventors: Robert W. Lade, Charlotte Amalie, V.I.; Gordon B. Spellman, Mequon, Wis.; Stanley V. Jaskolski, Sussex, Wis.; Herman P. Schutten, Elm Grove, Wis.; James R. Jaeschke, Waukesha, Wis.

[73] Assignee: Eaton Corporation, Cleveland, Ohio

[21] Appl. No.: 46,568

[22] Filed: Jun. 7, 1979

[51] Int. Cl.³ .................. H03K 17/72; H03K 17/94; H03K 17/687
[52] U.S. Cl. ........................ 307/252 A; 307/252 B; 307/252 VA; 307/311; 357/22; 357/30; 357/38; 357/39
[58] Field of Search ........... 307/252 A, 252 B, 252 J, 307/252 N, 252 VA, 311; 357/22, 30, 38, 39

[56] References Cited

U.S. PATENT DOCUMENTS

| | | | |
|---|---|---|---|
| 3,355,600 | 11/1967 | Mapham | 307/311 |
| 3,360,713 | 12/1967 | Howell | 323/22 |
| 3,467,836 | 9/1969 | Thomas | 307/249 |
| 3,567,972 | 3/1971 | Faust | 307/311 |
| 3,723,769 | 3/1973 | Collins | 307/252 VA |
| 3,777,188 | 12/1973 | Mazur | 307/311 |
| 3,812,405 | 5/1974 | Clark | 307/252 A |
| 3,891,866 | 6/1975 | Okuhara et al. | 307/252 A |
| 3,917,962 | 11/1975 | Pascente | 307/252 B |
| 4,039,863 | 8/1977 | Ohhinata et al. | 307/252 A |
| 4,129,785 | 12/1978 | Kadah | 307/311 X |

OTHER PUBLICATIONS

"Opto-Coupled FET Developed by GE", Electronic News, Nov. 27, 1978, p. 66.
R. I. Chen et al., "A Bilateral Analog FET Optocoupler", IEEE Transactions on Consumer Electronics, vol. CE 24, No. 3, Aug. 1978, pp. 247-260.
F. E. Gentry et al., "Semiconductor Controlled Rectifiers", Prentice-Hall, Inc. Englewood Cliffs, N.J., 1964, p. 292.

Primary Examiner—John Zazworsky
Attorney, Agent, or Firm—R. J. McCloskey; M. L. Union

[57] ABSTRACT

Various circuits and combinations of radiant energy responsive transducer means such as photovoltaic diodes connected to the gate of a depletion mode FET whose source and drain are connected to the gate and cathode of a thyristor, are disclosed to provide a semiconductor switch which is triggered into conduction solely by a small amount of radiant energy, without the need for a second triggering energy source, and which also affords immunity to unwanted dv/dt and temperature induced turn-on. Various modes of operation are disclosed, including the thyristor self-triggering into conduction, and/or being of the light-activated type itself and being directly triggered by impinging light, and/or being triggered by the light-responsive diode bias, and/or being triggered by a small bias supplied from a second set of photovoltaic diodes connected to the thyristor gate. Other combinations are disclosed providing zero-cross firing.

29 Claims, 8 Drawing Figures

RADIANT ENERGY ACTIVATED SEMICONDUCTOR SWITCH

BACKGROUND OF THE INVENTION

The field of the present invention is semiconductor switching devices activated by radiant energy, including electromagnetic waves and sound waves. Most prior devices require either an enormous amount of radiant energy or else a second triggering energy source to initiate conduction. There are other prior devices which require only a small amount of radiant energy, and do not need a second triggering energy source, but these devices are subject to unwanted nuisance tripping induced by dv/dt, noise, temperature, etc. There are still other devices which exhibit good turn-on sensitivity but require a second energy source to de-sensitize the device in order to provide immunity to dv/dt.

Generally, semiconductor swithces, such as SCR's, triacs, transistors, etc., can be turned ON to a conductive state by a triggering signal applied to a gate region thereof, whereby load current flows therethrough. In most applications, it is desirable to reduce the gate sensitivity in order to improve immunity to unwanted dv/dt, temperature, etc. induced turn-on. In an SCR for example, it is common to ohmically short the cathode-emitter region to the cathode-base region (shorted-emitter), and gating current is typically on the order of milliamps. Without the ohmic short, the SCR is extremely sensitive and may be triggered into conduction with a very small gate signal, typically on the order of microamps. This latter non-shorted-emitter design is subject to the above-noted problems with nuisance tripping.

The shorted-emitter design minimizes unwanted nuisance firing, but at the expense of gate sensitivity. Reduced gate sensitivity is not a significant obstacle if it is easy to supply, for example, milliamps instead of microamps to the gate.

Semiconductor switches which are activated solely by radiant energy are usually of the non-shorted-emitter design because they cannot sacrifice gate sensitivity. In the case of a light activated SCR, for example, it is not feasible to concentrate enough light energy on the SCR to cause turn-on when it has a shorted-emitter. Light activated SCR's are thus of the non-shorted-emitter design, and hence are sensitive to dv/dt, temperature, etc.

Continuing with the above example, numerous circuits have been devised to eliminate dv/dt and temperature problems in optical triggering applications. One approach is to use a shorted-emitter SCR, which may or may not be of the light activated type, and then insert a light activated switch in the gate circuit of the SCR which is in turn connected to the main load current line. Since the SCR has a shorted-emitter, a high amount of gate current is necessary to cause conduction. This gate current is supplied from the line terminal through the light activated switch to the gate terminal of the SCR, in response to impinging light.

A drawback of this latter type of arrangement is that two sources of energy are necessary for triggering, namely light energy and electrical energy. A second energy source, in addition to the light or other radiant energy, is needed to initiate conduction.

Another approach is to use a highly sensitive (eg. non-shorted-emitter) light activated SCR, and insert a bypass switch between gate and cathode which switch is in turn connected to the main load current line. Since the SCR is normally highly sensitive, it is subject to dv/dt induced nuisane tripping. The SCR is de-sensitized when the bypass switch is activated by line current.

A drawback of this last approach, as before, is that two sources of energy are necessary. Light energy impinging on the SCR is used to initiate conduction, and a second energy (eg. current from the line) is necessary to de-sensitize the device for dv/dt immunity purposes.

SUMMARY OF THE INVENTION

An object of the present invention is to provide an improved radiant energy activated semiconductor switching device.

Another object of the invention is to provide a switching device of the aforementioned character which affords both:

(a) immunity to unwanted dv/dt, temperature, etc. induced nuisance tripping; and (b) triggering solely by the radiant energy source; each without the aid of a second energy source other than radiant energy.

Another object of the invention is to provide a switching device of the aforementioned character which may be readily and inexpensively used in switching applications where electrical isolation is desired.

Another object of the invention is to provide a switching device of the aforementioned character which may be monolithically integrated in a single substrate.

Another object of the invention is to provide a switching device of the aforementioned character which affords zero-cross firing with respect to alternating line voltage.

Another object of the invention is to provide an improved solid state relay.

Other objects and advantages will hereinafter appear.

DETAILED DESCRIPTION

Figure 1:
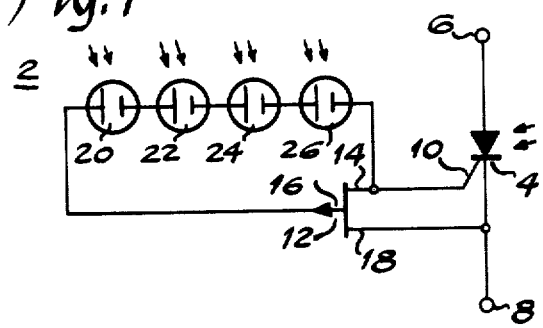
FIG. 1 is a circuit diagram of a radiant energy activated semiconductor switch constructed in accordance with the invention.

FIG. 1 shows a radiant energy activated semiconductor switching device generally designated 2. The device includes a switch, such as thyristor 4 having a high resistance, low current OFF state between a pair of main terminals such as anode 6 and cathode 8 and is switchable to a low resistance, high current ON state by a trigger signal applied to a control or gate terminal 10. The thyristor is a four layer device having an end region, anode emitter, connected to anode 6, a pair of middle regions, anode base and cathode base, with the cathode base connected to control or gate terminal 10, and another end region, cathode emitter, connected to cathode 8. The thyristor is of the non-shorted-emitter design, i.e. the cathode base is not ohmically shorted to the cathode emitter.

Continuing with FIG. 1, a normally conductive variable conductance means, such as depletion mode field effect transistor (FET) 12, is connected between gate 10 and cathode 8. Since the channel in a depletion mode FET is normally conductive, there is an effective shunt across the thyristor gate to cathode (shorted-emitter), whereby the thyristor's gate is de-sensitized and relatively immune to unwanted dv/dt and temperature induced turnon due to the current path from anode 6 to the anode emitter end region to the anode base region to the cathode base region to gate 10 to FET source 14 through the conduction channel under gate 16 to drain 18 to cathode 8, thus bypassing the cathode base—cathode emitter junction. Electrical bias applied to FET gate 16 decreases the conduction channel width, thus forcing more of the current from anode 6 to flow through thyristor 4, which in turn reduces the amount of signal current that has to be applied to thyristor gate 10 to cause turn-on of the thyristor. When the FET channel is completely pinched-off, the thyristor has maximum gate sensitivity, and the minimum amount of gate current is necessary to switch the thyristor ON.

Transducer means responsive to impinging radiant energy to develop an electrical bias potential is connected to the control terminal of the normally conductive variable conductance means to bias the latter to a non-conductive state in response to radiant energy. In the case of light, the transducer means is preferably a plurality of series connected photovoltaic diodes 20, 22, 24 and 26, with the anode of the first diode 20 connected to FET gate 16 and the cathode of the last diode 26 connected to FET source 14, FIG. 1, or to FET drain 18, FIG. 2. The photovoltaic diodes develop an electrical bias potential in response to impinging light, which potential biases FET gate 16 with respect to the FET source or drain to spread the depletion region and pinch off the conduction channel, thus removing the thyristor gate to cathode short. The thyristor is thus extremely sensitive as long as light is shining on the photovoltaic diodes.

In FIG. 1, thyristor 4 is of the light activated type, and the same light shining on the photovoltaic diodes also shines on the thyristor. Device 2 thus turns ON in response to impinging light, without any secondary triggering energy source such as batteries, auxiliary power supplies, or line current. Light energy sensitizes the thyristor due to the photovoltaic diodes such that the same light can also activate the thyristor since only a small amount of energy is now needed therefor. Furthermore, in the absence of light, device 2 is relatively immune to unwanted dv/dt and temperature induced turn-on because the thyristor gate is de-sensitized without the photovoltaic diode bias.

As an alternative to FIG. 1, and depending on gate sensitivity, the thyristor could intrinsically self-trigger, including for example, being thermally triggered at room temperature or at the temperature of its operating environment, instead of being of the light activated type. U.S. Pat. Nos. 3,971,056 and 4,112,458, Jaskolski et al, disclose thermally triggered thyristors and design details for specific switching temperatures. Device 2 would thus self-trigger when enabled by light shining on the photovoltaic diodes. Again, light is the only energy source necessary for firing; and the device exhibits immunity to nuisance tripping in the absence of light.

Figure 2:
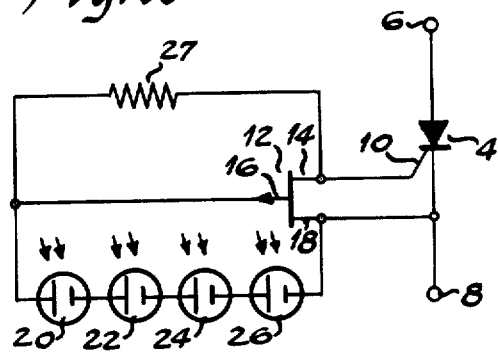
FIG. 2 shows alternate positioning of the transducer means of FIG. 1.

The embodiment of FIG. 2 shows another alternative wherein a resistor 27 is connected between the anode of photovoltaic diode 20 and thyristor gate 10. The light responsive photovoltaic diode bias which pinches off the FET channel also develops a voltage across resistor 27 which gate drives the thyristor into conduction. The resistor 27 must be large enough to provide sufficient voltage at FET gate 16 to insure pinch-off thereof, otherwise current through resistor 27 would merely flow through the FET channel, not to thyristor gate 10. Again, light is the only source of triggering energy, and the device exhibits desirable immunity to nuisance tripping in the absence of light.

Figure 3:
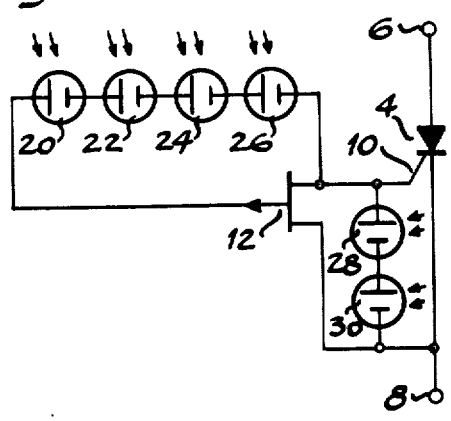
FIG. 3 shows second transducer means which may be incorporated in FIGS. 1 or 2.

In FIG. 3, photovoltaic diodes 28 and 30 are connected in series between gate 10 and cathode 8. These diodes develop an electrical bias potential in response to impinging light to deliver a gating signal to gate 10 to trigger the thyristor into conduction because the same light has caused photovoltaic diodes 20, 22, 24 and 26 to bias the variable conductance means to a blocking state. Photovoltaic diodes 28 and 30 have a relatively larger area and develop a larger current but smaller voltage than photovoltaic diodes 20, 22, 24 and 26 because current is the significant parameter in the thyristor gate trigger signal and voltage is the significant parameter in FET channel pinch-off.

Figure 4:
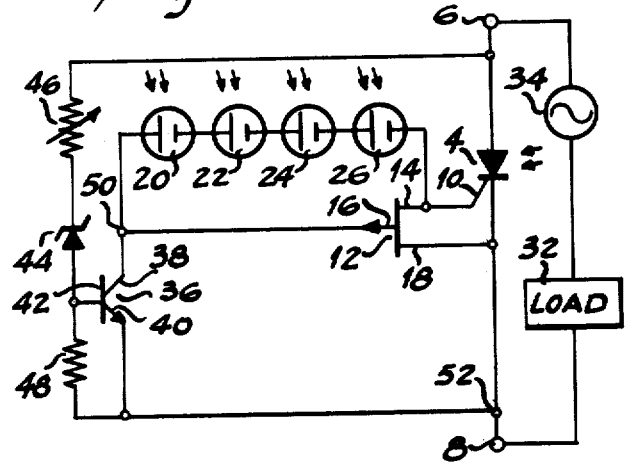
FIG. 4 shows additional circuitry which may be incorporated in FIGS. 1, 2 or 3 to provide a combination affording zero-cross firing.

FIG. 4 shows a zero-cross firing arrangement wherein the thyristor can only be turned ON when the alternating voltage thereacross is at or near zero. Thyristor 4 is shown in circuit with a load 32 and an alternating current power source 34. A junction transistor 36 has a collector 38 connected to FET gate 16, an emitter 40 connected to thyristor cathode 8, and a base 42 connected through zener diode 44 and adjustable resistor 46 to thyristor anode 6. A resistor 48 is connected between base 42 and cathode 8. As the voltage at anode 6 rises during the cycle, junction transistor 36 will be driven into conduction, whereby even if light shines on photovoltaic diodes 20, 22, 24 and 26, current therefrom will be shunted through junction transistor 36, and away from FET gate 16, thus preventing the FET from being biased off. This prevents the thyristor from being turned ON because the gate 10 to cathode 8 short has not been removed. When the voltage at anode 6 is at or near zero, junction transistor 36 is in a blocking state because of insufficient base drive to base 42, and the photovoltaic diode bias will be applied to FET gate 16 driving the FET non-conductive, thus removing the thyristor gate to cathode short and enabling the thyristor to be turned ON. It is important to note that line current from source 34 is not used to trigger the thyristor. Zener diode 44 is chosen to have a certain breakdown threshold relative to the pinch-off threshold to FET 12 such that as the voltage at anode 6 rises from zero, the zener will not break down, and hence junction transistor 36 will remain off, until the bias from photovoltaic diodes 20, 22, 24 and 26 has pinched off the FET channel, thus enabling turn-on of thyristor 4. Without some sort of threshold means such as zener 44 preventing turn-on of junction transistor 36 until the FET has been biased off and the line current has risen above the thyristor's minimum holding value, the thyristor could not be turned ON. Such threshold means could alternatively be inserted between collector 38 and junction point 50, or between emitter 40 and junction point 52, or be internal to transistor 36 according to its junction voltage drops.

Resistor 48 provides an alternate current path to lower the off state leakage current of transistor 36 and to reduce the latter's sensitivity to leakage current of zener 44. Resistor 46 may be used to adjust the phase angle of thyristor turn ON by limiting the base drive current to transistor 36. The device of FIG. 4 thus provides an optically triggered switch, but only near zero-crossing of the line power supply.

Figure 5:
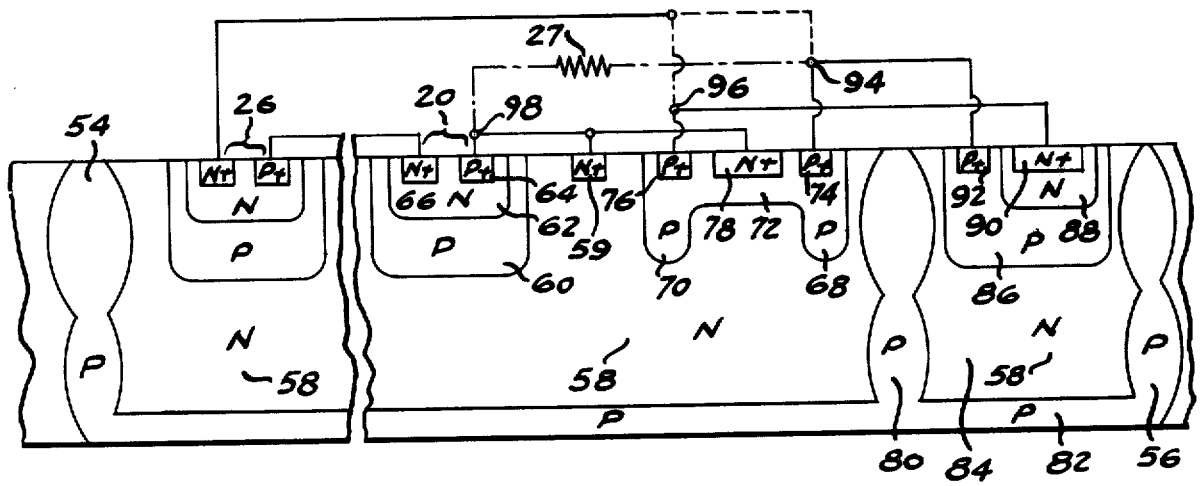
FIG. 5 is a substrate drawing of an integrated version of FIGS. 1 and 2.

FIG. 5 shows the integration of the circuit of FIGS. 1 and 2. P type isolation moats 54 and 56 separate the circuit from the other identical circuits on the wafer slice substrate 58. The photovoltaic diodes 20, 22, 24 and 26 are identical and only the first and last are shown, 20 and 26. Depending on the voltage needed for pinch-off of the FET, a whole array of diodes can be formed. P region 60 is an isolation tub diffused into N type substrate 58 into which N type diode cathode 62 is diffused. P+ diode anode region 64 is diffused into region 62, as is N+ diode cathode connection region 66. Region 66 is ohmically connected to the anode P+ region of diode 22, with the remaining diodes being identical and ohmically connected in series. FET 12 has P type source and drain regions 68 and 70 diffused into substrate 58 and connected by common P type channel region 72. P+ type source and drain connection regions 74 and 76 are diffused into regions 68 and 70, and N+ type channel connection region 78 is diffused into region 72. P type isolation region 80 separates FET 12 from thyristor 4 to prevent regenerative and/or parasitic action therebetween. An unilateral thyristor 4 is shown, eg. an SCR, and has a bottom P type anode emitter region 82 which is common with regions 54, 56 and 80 and extends all the way across the bottom of the wafer. A portion of N type substrate 58 serves as the thyristor anode base region 84. P type thyristor cathode base region 86 is diffused into region 58. N type thyristor cathode emitter region 88 is diffused into region 86. N+ type thyristor cathode emitter connection region 90 is diffused into region 88. P+ type thyristor gate connection region 92 is diffused into region 86. The thyristor cathode emitter connection region 90 is ohmically connected to FET drain connection region 76. Thyristor gate connection region 92 is ohmically connected to FET source connection region 74. Diode 20 anode region 64 is ohmically connected to N+ substrate connection region 59 and to FET channel connection region 78. Ohmic connection of the cathode of diode 26 to junction point 94, as shown in dashed line, yields the embodiment of FIG. 1. Ohmic connection of the cathode of diode 26 to junction point 96, and ohmic connection of junction point 94 through resistor 27 to junction point 98, as shown in dot/dash line, yields the embodiment of FIG. 2. Different ohmic connections of some of the diodes and/or additional diodes integrated into the substrate yields the embodiment of FIG. 3.

Figure 6:
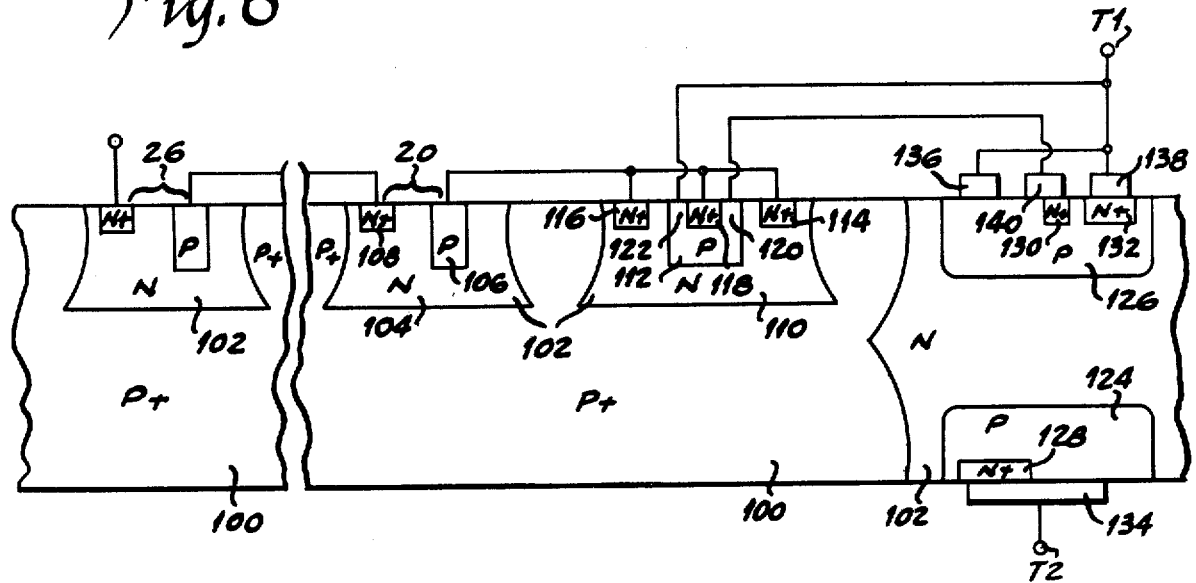
FIG. 6 is an alternate embodiment of FIG. 5.

FIG. 6 shows another integration of the circuit of FIGS. 1 and 2. A N type substrate 102 has a P+ type section 100 formed therein by deep isolation diffusions. The photovoltaic diodes are identical and only two are shown, 20 and 26. Depending on the voltage needed for pinch-off of the FET, a whole array of diodes can be formed. Isolated N section 104 of substrate 102 forms the diode cathode into which is diffused P type diode anode 106 and N+ type diode cathode connection region 108. Region 108 is ohmically connected to the anode P region of diode 22, with the remaining diodes being identical and ohmically connected in series. FET 12 has a N region 110 diffused into substrate 100. P region 112 is diffused into isolated N section 110 of the substrate, whereafter N+ regions 114 and 116 are diffused into region 110 and N+ region 118 into region 112 to form P type source and drain regions 120 and 122, respectively. A bilateral thyristor, such as triac, is shown and has P type regions 124 and 126 diffused into substrate 102. N+ region 128 is diffused into region 124, and N+ regions 130 and 132 are diffused into region 126. A common ohmic connection 134 is made to regions 124 and 128, with a terminal T2 connected thereto. An ohmic connection 136 is made to region 126, and an ohmic connection 138 is made to region 132. Regions 136 and 138 are both ohmically connected to a terminal T1. A common ohmic gate connection 140 is made to regions 126 and 130. Current in the direction from T1 to T2 flows from connection 136 through region 126 as anode emitter, region 102 as anode base, region 124 as cathode base, and region 128 as cathode emitter, to connection 134. Current in the direction from T2 to T2 flows from connection 134 through region 124 as anode emitter, region 102 as anode base, region 126 as cathode base, and region 132 as cathode emitter, to connection 138. P region 106 is ohmically connected to N+ regions 114 and 116 and to FET gate 118. Source 120 is connected to thyristor gate 140, and drain 122 is connected to T1. Ohmic connection of the N+ cathode of diode 26 to source 120 yields the circuit of FIG. 1. Ohmic connection of the N+ cathode of diode 26 to drain 122 yields the embodiment of FIG. 2; a resistor 27 may be added between region 106 and thyristor gate 140. Different ohmic connections of some of the diodes and/or additional integrated diodes yields the embodiment of FIG. 3.

Figure 7:
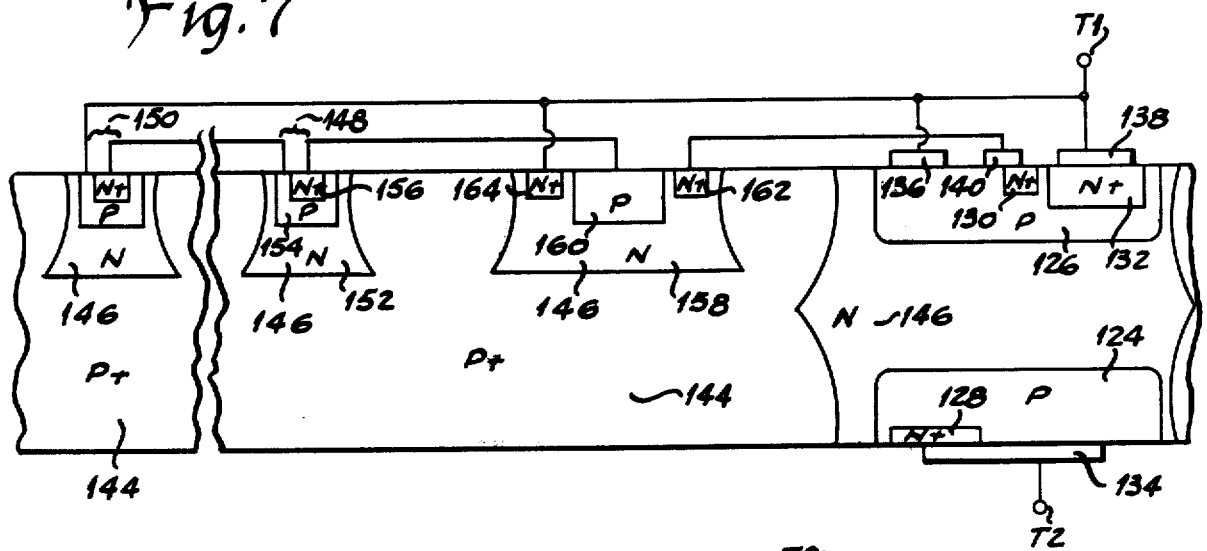
FIG. 7 is another alternate embodiment of FIG. 5.
Figure 8:
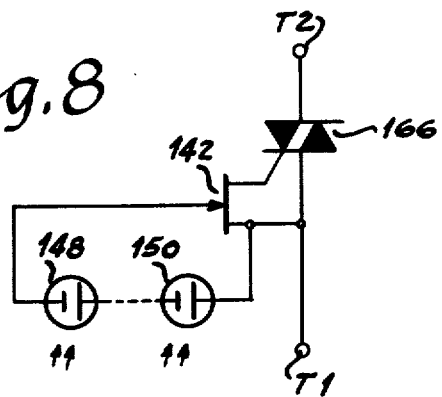
FIG. 8 is a circuit diagram of FIG. 7.

FIG. 7 shows another integration of the invention employing a different polarity FET 142 as shown in the circuit diagram of FIG. 8. FET 142 is N-channel; FET 12 of FIGS. 1-6 is P-channel. N type substrate 146 has a P+ type section 144 formed therein by deep isolation diffusions, similar to FIG. 6. The photovoltaic diodes are identical and only the first and last are shown 148 and 150; again, the number of diodes is determined in part by the required FET pinch-off voltage. Into isolated N section 152 of substrate 146 is diffused P type diode anode 154 and N+ type diode cathode 156. The remaining diodes are identical and ohmically connected in series. FET 142 is formed by the diffusions of P type gate region 160 and N+ type source and drain regions 162 and 164 into isolated N section 158 of the substrate. A bilateral thyristor 166 is shown and is formed similarly to the triac of FIG. 6, and the same reference characters have been used to facilitate understanding. Thyristor gate 140 is ohmically connected to source 162. Diode cathode 156 is ohmically connected to FET gate 160. The anode of diode 150 is ohmically connected to drain 164 which is ohmically connected to T1. This embodiment further enhances dv/dt insensitivity.

It is recognized that various modifications are possible within the scope of the appended claims.

What is claimed is:

1. A radiant energy activated semiconductor switching device comprising in combination:
   a semiconductor switch having a plurality of alternating conductivity type regions, including a pair of end regions and a middle control region, and switchable from a low current OFF state to a high current ON state between said end regions by a triggering signal applied to said control region;

normally conductive variable conductance means connected between said control region and one of said end regions of said switch, said variable conductance means having a control terminal for varying the conduction value thereof between a conductive state and a state having greater conductivity, said normally conductive variable conductance means being conductive when no potential is applied to said control terminal and being less conductive when potential is applied to said control terminal, the requisite magnitude of said triggering signal decreasing as the conduction of said variable conductance means decreases; and transducer means connected to said control terminal of said variable conductance means and responsive to impinging radiant energy to develop an electrical bias potential which biases said variable conductance means and decreases the conduction value thereof.

2. The invention according to claim 1 wherein said transducer means is connected between said control terminal of said variable conductance means and said one end region of said switch.

3. The invention according to claim 1 wherein said transducer means drives said variable conductance means sufficiently non-conductive in response to radiant energy that said switch intrinsically self-triggers to said ON state.

4. The invention according to claim 1 wherein said switch is itself of the radiant energy activated type, and wherein said transducer means continuously drives said variable conductance means sufficiently non-conductive in response to radiant energy that said switch is triggered to said ON state by radiant energy.

5. A radiant energy activated semiconductor switching device comprising in combination:
   a semiconductor switch having a plurality of alternating conductivity type regions, including a pair of end regions and a middle control region, and switchable from a low current OFF state to a high current ON state between said end regions by a triggering signal applied to said control region;
   normally conductive variable conductance means connected between said control region and one of said end regions of said switch, said variable conductance means having a control terminal for varying the conduction value thereof, the requisite magnitude of said triggering signal decreasing as the conduction of said variable conductance means decreases;
   transducer means connected to said control terminal of said variable conductance means and responsive to impinging radiant energy to develop an electrical bias potential which biases said variable conductance means and decreases the conduction value thereof; and
   second transducer means connected between said control region and said one end region of said switch and responsive to impinging radiant energy to develop an electrical bias potential which biases said control region of said switch and supplies at least part of the reduced triggering signal value causing switching to said ON state.

6. A radiant energy activated semiconductor switching device comprising in combination:
   a semiconductor switch having a plurality of alternating conductivity type regions, including a pair of end regions and a middle control region, and switchable from a low current OFF state to a high current ON state between said end regions by a triggering signal applied to said control region;
   normally conductive variable conductance means connected between said control region and one of said end regions of said switch, said variable conductance means having a control terminal for varying the conduction value thereof, the requisite magnitude of said triggering signal decreasing as the conduction of said variable conductance means decreases;
   transducer means connected to said control terminal of said variable conductance means and responsive to impinging radiant energy to develop an electrical bias potential which biases said variable conductance means and decreases the conduction value thereof; and
   resistance means connected between said control terminal of said variable conductance means and said control region of said switch, and through which is delivered from said transducer means to said control region of said switch at least part of the reduced triggering signal value causing switching to said ON state.

7. A radiant energy activated semiconductor switching device comprising in combination:
   a semiconductor switch having a plurality of alternating conductivity type regions, including a pair of end regions and a middle control region, and switchable from a low current OFF state to a high current ON state between said end regions by a triggering signal applied to said control region, said end regions of said switch being connected to an alternating current supply line;
   normally conductive variable conductance means connected between said control region and one of said end regions of said switch, said variable conductance means having a control terminal for varying the conduction value thereof, the requisite magnitude of said triggering signal decreasing as the conduction of said variable conductance means decreases;
   transducer means connected to said control terminal of said variable conductance means and responsive to impinging radiant energy to develop an electrical bias potential which biases said variable conductance means and decreases the conduction value thereof; and
   zero-cross firing means comprising normally non-conductive variable resistance means connected between said control terminal of said variable conductance means and said one end region of said switch, said variable resistance means having a control terminal for varying the resistance value thereof, said control terminal of said variable resistance means being connected to said supply line such that in response to rising supply voltage, said variable resistance means exhibits a decreasing resistive value which in turn diverts more current therethrough from said transducer means away from said control terminal of said variable conductance means, increasing the conduction value of the latter and preventing triggering of said switch to said ON state until said supply voltage drops sufficiently to enable said variable resistance means to resume its normally non-conductive state.

8. The invention according to claim 7 further comprising threshold means in circuit with said variable resistance means, such that if said supply voltage is below a predetermined value, radiant energy responsive transducer current is initially diverted to said control terminal of said variable conductance means to drive the latter sufficiently non-conductive to permit triggering of said switch to said ON state, and such thay if said supply voltage is above said predetermined value when radiant energy impinges on said transducer means, said transducer current flows to said variable resistance means, without initial diversion to said variable conductance means, to prevent turn-on of said switch.

9. A radiant energy activated semiconductor switching device comprising in combination:
   a semiconductor switch having a plurality of alternating conductivity type regions, including a pair of end regions and a middle control region, and switchable from a low current OFF state to a high current ON state between said end regions by a triggering signal applied to said control region;
   normally conductive variable conductance means connected between said control region and one of said end regions of said switch, said variable conductance means having a control terminal for varying the conduction value thereof, the requisite magnitude of said triggering signal decreasing as the conduction of said variable conductance means decreases; and
   transducer means connected to said control terminal of said variable conductance means and responsive to impinging radiant energy to develop an electrical bias potential which biases said variable conductance means and decreases the conduction value thereof, said transducer means being connected between said control terminal of said variable conductance means and said control region of said switch.

10. A radiant energy activated semiconductor switching device comprising in combination:
   a semiconductor switch having a plurality of alternating conductivity type regions, including a pair of end regions and a middle control region, and switchable from a low current OFF state to a high current ON state between said end regions by a triggering signal applied to said control region;
   normally conductive variable conductance means connected between said control region and one of said end regions of said switch, said variable conductance means having a control terminal for varying the conduction value thereof, the requisite magnitude of said triggering signal decreasing as the conduction of said variable conductance means decreases;
   transducer means connected to said control terminal of said variable conductance means and responsive to impinging radiant energy to develop an electrical bias potential which biases said variable conductance means and decreases the conduction value thereof, said transducer means being connected between said control terminal of said variable conductance means and said one end region of said switch; and
   resistance means connected between said control terminal of said variable conductance means and said control region of said switch, and which has a resistance value great enough to insure that sufficient voltage from said transducer means is obtained at said control terminal of said variable conductance means to drive the latter sufficiently non-conductive to permit triggering of said switch to said ON state, at least part of the triggering signal current value causing switching to said ON state being delivered from said transducer means through said resistance means to said control region of said switch.

11. A light activated semiconductor switching device comprising in combination:
   a semiconductor switch having a plurality of alternating conductivity type regions, including a pair of end regions and a middle control region, and switchable from a low current OFF state to a high current ON state between said end regions by a triggering signal applid to said control region;
   normally conductive variable conductance means connected between said control region and one of said end regions of said switch, said variable conductance means having a control terminal for varying the conduction value thereof, the requisite magnitude of said triggering signal decreasing as the conduction of said variable conductance means decreases; and
   photovoltaic converter means connected to said control terminal of said variable conductance means and responsive to impinging light to develop an electrical bias potential which biases said variable conductance means and decreases the conduction value thereof.

12. The invention according to claim 11 wherein said variable conductance means comprises a depletion mode field effect transistor, and said converter means comprises one or more photovoltaic diodes developing sufficient electrical bias potential in response to light to pinch off the conduction channel in said field effect transistor.

13. The invention according to claim 12 further comprising a second set of one or more photovoltaic diodes connected between said control region and said one end region of said switch, such that in response to light, said first set of one or more photovoltaic diodes pinches off the channel in said field effect transistor, and said second set of photovoltaic diodes supplies at least part of said triggering signal to turn said switch ON.

14. The invention according to claim 13 wherein said second set of one or more photovoltiac diodes has a larger area and develops a larger current but smaller voltage relative to said first set of one or more photovoltaic diodes.

15. The invention according to claim 12 further comprising resistance means connected between said control region of said switch and said control terminal of said variable conductance means which is connected to the gate of said field effect transistor, the value of said resistance means being great enough to insure that sufficient bias from said one or more photovoltaic diodes is applied to pinch off the conduction channel in said field effect transistor, at least part of said trigger signal being delivered through said resistance means from said one or more photovoltaic diodes.

16. The invention according to claim 12 wherein said end regions of said switch are connected to an alternating current supply line, and further comprising a junction transistor having collector and emitter connected between said control terminal of said variable conductance means and said one end region of said switch, said junction transistor having a base connected to said supply line such that in response to rising supply voltage, said junction transistor conducts more heavily which in turn diverts more current therethrough from said one or more photovoltaic diodes away from the gate of said field effect transistor, increasing the conduction of the latter and preventing triggering of said switch to said ON state until said supply voltage drops sufficiently to enable said junction transistor to resume its normally blocking state.

17. The invention according to claim 16 further comprising threshold means in circuit with said junction transistor and having a breakover value relative to the rising value of said supply voltage such that when said supply voltage is below a predetermined magnitude when light impinges on said one or more photovoltaic diodes, current from the latter is initially diverted to the gate of said field effect transistor to effect pinch-off thereof and permit turn-on of said switch, and such that when said supply voltage is above said predetermined magnitude when light impinges on said one or more photovoltaic diodes, current from the latter is diverted to said junction transistor, without initial diversion to said gate of said field effect transistor, to prevent turn-on of said switch.

18. The invention according to claim 17 wherein said threshold means is connected between said supply line and the base of said junction transistor to delay saturation of the latter until said rising supply voltage reaches said predetermined magnitude.

19. The invention according to claim 17 wherein said threshold means is connected in circuit with one of the emitter and collector of said junction transistor such that when said supply voltage reaches said predetermined magnitude, the voltage drop across said threshold means and said junction transistor is less than the pinch-off threshold of said field effect transistor.

20. The invention according to claim 17 wherein said threshold means comprises a zener diode.

21. The invention according to claim 17 further comprising a resistor connected between the base of said junction transistor and said one end region of said switch to provide an alternate current path for reducing collector leakage current of said junction transistor and reducing the latter's sensitivity to leakage current of said threshold means.

22. The invention according to claim 12 wherein said one or more photovoltaic diodes are connected in series between the gate of said field effect transistor and said control region of said switch.

23. The invention according to claim 12 wherein said one or more photovoltaic diodes are connected in series between the gate of said field effect transistor and said one end region of said switch.

24. The invention according to claim 12 wherein said one or more photovoltaic diodes sufficiently pinch-off the conduction channel of said field effect transistor in response to light such that said switch intrinsically self-triggers to said ON state.

25. The invention according to claim 12 wherein said switch is a light activated thyristor, and wherein said one or more photovoltaic diodes sufficiently pinch-off the conduction channel of said field effect transistor in response to light such that said switch is triggered to said ON state by the same said light.

26. The invention according to claim 12 wherein said combination is monolithically integrated in a common substrate.

27. The invention according to claim 26 wherein said switch is a vertically integrated thyristor, and said field effect transistor and said one or more photovoltaic diodes are laterally integrated.

28. The invention according to claim 27 wherein the one or moe anode-cathode junctions of said one or more photovoltaic diodes and at least one active junction of said thyristor are exposed at the same surface of said substrate.

29. The invention according to claim 28 wherein said thyristor is of the light activated type, such that light impinging on said last mentioned substrate surface causes said one or more photovoltaic diodes to pinch off the channel in said field effect transistor and also activates said thyristor to said ON state.

* * * * *